United States Patent [19]
Kuczynski

[11] Patent Number: 5,629,355
[45] Date of Patent: May 13, 1997

[54] POLYMERIC SULFONIUM SALT PHOTOINITIATORS

[75] Inventor: Joseph P. Kuczynski, Rochester, Minn.

[73] Assignee: International Business Machines Corporation, Armonk, N.Y.

[21] Appl. No.: 654,564

[22] Filed: May 29, 1996

Related U.S. Application Data

[62] Division of Ser. No. 455,218, May 31, 1995, Pat. No. 5,550,171.

[51] Int. Cl.$^6$ .............................. C08F 2/46; G11B 5/012
[52] U.S. Cl. .............................. 522/31; 522/904; 556/64; 360/97.01
[58] Field of Search .......................... 360/97.01; 522/31, 522/904; 556/64

[56] References Cited

U.S. PATENT DOCUMENTS

| | | | |
|---|---|---|---|
| 4,136,102 | 1/1979 | Crivello | 260/440 |
| 4,161,478 | 7/1979 | Crivello | 260/327 B |
| 4,173,476 | 11/1979 | Smith et al. | 430/280 |
| 4,197,174 | 4/1980 | Chang | 204/159.11 |
| 4,440,541 | 4/1984 | Iyer | 568/56 |
| 4,442,197 | 4/1984 | Crivello et al. | 430/280 |
| 4,684,671 | 8/1987 | Tsuchiya et al. | 522/31 |
| 5,047,567 | 9/1991 | Huan et al. | 556/42 |
| 5,047,568 | 9/1991 | Angelo et al. | 556/64 |
| 5,380,923 | 1/1995 | Wright et al. | 562/113 |

OTHER PUBLICATIONS

Synthesis of High Melecular Weight Poly(phenylene sulfide) by Oxidative Polymerization via Poly(sulfonium cation) fromMethyl Phenyl Sulfoxide, Macromolecules 26 pp. 7144–7148, Tsuchida et al. 1993.

*Primary Examiner*—Mark Chapman
*Attorney, Agent, or Firm*—Merchant, Gould, Smith, Edell, Welter & Schmidt, P.A.

[57] ABSTRACT

The invention is a polymeric photoinitiator having the formula:

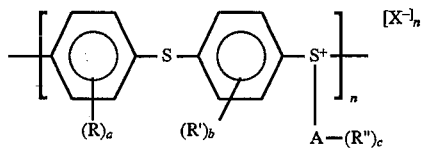

wherein n=10 to 50; each of a and b may be 0–4 while c is 0–5; A is an alkyl or aryl group; X is an anion; and each of R, R', and R" is independently H or one or more groups substituted onto the respective phenyl moieties. The substituted groups are independently selected from various kinds of groups excluding basic groups such as amino groups. Preferably, they are a hydrogen atom, halogen atom (e.g., F, Cl, Br, and I), nitro group, alkoxy group (e.g., $CH_3O$— and $C_2H_5O$—), $C^1$–$C_{18}$ aliphatic group (e.g., hydrocarbon group such as $CH_3$—, $C_2H_5$—, and $(CH_3)_2CH$—; cyclic hydrocarbon group such as cyclohexyl group; and those which contain a heteroatom in the main chain or substituent group. The substituted groups may also be a $C_1$–$C_{18}$ aliphatic group having at least one hydroxyl group or a $C_3$–$C_{19}$ aliphatic group having a group of —$OCH_2CH_2O$—. The invention also comprises a method of synthesizing this polymer and adhesive compositions and computer components using and made with the polymeric photoinitiator of the invention. The invention also comprises a method of reducing outgassing from the component parts of data storage systems.

7 Claims, 2 Drawing Sheets

POLYMERIC SULFONIUM SALT PHOTOINITIATORS

This is a division of application Ser. No. 08/455,218, filed May 31, 1995, now U.S. Pat. No. 5,550,171 which application is incorporated herein by reference.

FIELD OF THE INVENTION

Generally, the invention relates to sulfonium salt photoinitiators. More specifically, the invention relates to polymeric sulfonium salt photoinitiators which are preferably used in information storage and retrieval devices such as data storage systems and data storage disks.

BACKGROUND OF THE INVENTION

Photoinitiator chemicals are those compounds which mediate, facilitate or otherwise cause those reactions which occur during the curing of an adhesive. Curing is a chemical phenomenon which occurs when certain atomic bonds are broken and reformed to create a compositional form which cannot be recast through the application of heat. These adhesives are generally regarded as "thermosetting" and are most useful in the creation of a strong, heat resistant, rigid adhesive bond. Through the application of ultraviolet energy, a photoinitiator constituent facilitates the reformation of chemical bonds in a thermoset adhesive to cure the adhesive.

One application for photoinitiator cured thermoset adhesives is in the assembly of component parts used in data storage and retrieval systems such as CD-ROM technology and hard disk storage technology. The manufacture of hard disk drives involves the use of sundry adhesives spanning numerous applications. Due to the automated nature of the hard drive assembly process, rapid adhesive tack time is of paramount importance. In order to accommodate such process requirements, photosensitive adhesives are often the material of choice. Among this class of adhesives, photosensitive, epoxy-based formulations are often selected due to their rapid fixture times, appreciable dark reaction, and excellent physical properties.

During the manufacture of hard disk drives, adhesives are used for sundry assembly applications. Volatile compounds from the adhesives have been known to deposit on the disk surface resulting in head/disk interface failures. These compounds are typically low molecular weight entities that readily diffuse through the bulk of the adhesive and subsequently effuse into the disk environment. Low molecular weight photoinitiator compounds are exemplified by Crivello et al U.S. Pat. No. 4,136,102 and 4,161,478 which each teach onium salt-type initiators of phosphorous, arsenic, and antimony. Crivello teaches in each of these patents that the onium salts can be employed as cationic photoinitiators when used with a variety of organic resins.

Smith et al, U.S. Patent No. 4,173,476 also teaches salt complexes which may be used as photoinitiators and epoxy compositions. The disclosed compounds are triarylsulfonium complex salts having a discrete molecular weight. Crivello et al, U.S. Pat. No. 4,442,197 also teaches photocurable compositions. The disclosed compositions are described as dialkylphenacyl sulfonium salts or hydroxyaryldialkyl sulfonium salts of a discrete molecular weight. These compounds are polymerizable into epoxy resins through the use of ultraviolet light at a wave length greater than 300 nm.

Chang U.S. Pat. No. 4,197,174 teaches a method for producing bis-[4(diphenylsulfonio)phenyl] sulfide bis-$MX_6$ initiators which are useful in the cationic polymerization of monomer formulations. Here again, the disclosed compositions are polymerized into epoxy compositions through the application of ultraviolet energy.

Iyer, U.S. Pat. No. 4,400,541 discloses bis-(diphenylsulfoniophenyl)-sulfide bis-chloride salts again of discrete molecular weight which are used as starting materials for the manufacture of other salts which has utility as catalyst for curing ultraviolet activated coating compositions. Angelo et al, U.S. Pat. No. 5,047,568 teaches sulfonium salts having a discrete molecular weight which may be used as photoinitiators for various adhesives.

However, the use of these photoinitiators does not alleviate problems which occur, especially in disk drive assemblies. After assembly, machines carrying disk drive units may be shipped to any number of locations in the world and subsequently stored. Often times, and in most cases, storage conditions may vary radically and defy control by the initial manufacturer. Conditions of high temperature and high humidity are more the rule than the exception in many countries. In such conditions, disk drives have a tendency to film due to many of the chemicals present in the disk drive environment.

A large body of evidence exists implicating various compounds (e.g., silicones and acrylates) in head/disk interface failures. Trial and analysis over time has illustrated that the composition of the film which forms on disk drives is corrosion and has a high concentration of sulphur. The use of sulfonium salts such as those found disclosed in the patents cited above leads to low molecular weight volatile species which outgas and deposit upon the disk drive to form these corrosive films.

Therefore, there is a need in the art for photoinitiator compounds and polymer systems which will effectively cure adhesives to a desired bond and which will not outgas low molecular weight constituents which, in turn, will corrode disk drive mechanisms or other component parts.

SUMMARY OF THE INVENTION

In accordance with a first aspect of the invention there is provided a polymeric photoinitiator having the formula:

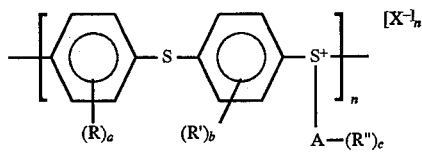

wherein n=10 to 150; each of a and b are 0–4 and c is 0–5; A is a branched or unbranched alkyl or a substituted or unsubstituted aryl; X is an anion; and each of R, R', R", and R'" is H or one or more groups substituted onto the respective phenyl. The substituted group is independently selected from various kinds of groups excluding basic groups such as amino groups. Preferably, they are a hydrogen atom, halogen atom (e.g., F, Cl, Br, and I), nitro group, alkoxy group (e.g., $CH_3O-$ and $C_2H_5O-$), $C_1-C_{18}$ aliphatic group (e.g., hydrocarbon group such as $CH_3-$, $C_2H_5-$, and $(CH_3)_2CH-$); cyclic hydrocarbon group such as cyclohexyl group; and those which contain a heteroatom in the main chain or substituent group. Each of R, R', and R" may also be a $C_1-C_{18}$ aliphatic group having at least one hydroxyl group or a $C_3-C_{19}$ aliphatic group having a group of $-OCH_2CH_2O-$.

In accordance with another aspect of the invention, there is provided an adhesive composition comprising the photoinitiator of the invention.

In accordance with a further aspect of the invention, there is provided a data storage system assembled using adhesives cured with the photoinitiator of the invention.

In accordance with an additional aspect of the invention, there is provided a method of synthesizing the polymeric photoinitiator of the invention.

The polymeric sulfonium salt photoinitiators have lower volatility and less tendency to outgas volatile compounds.

DETAILED DISCUSSION OF THE CLAIMED INVENTION

Figure 1:
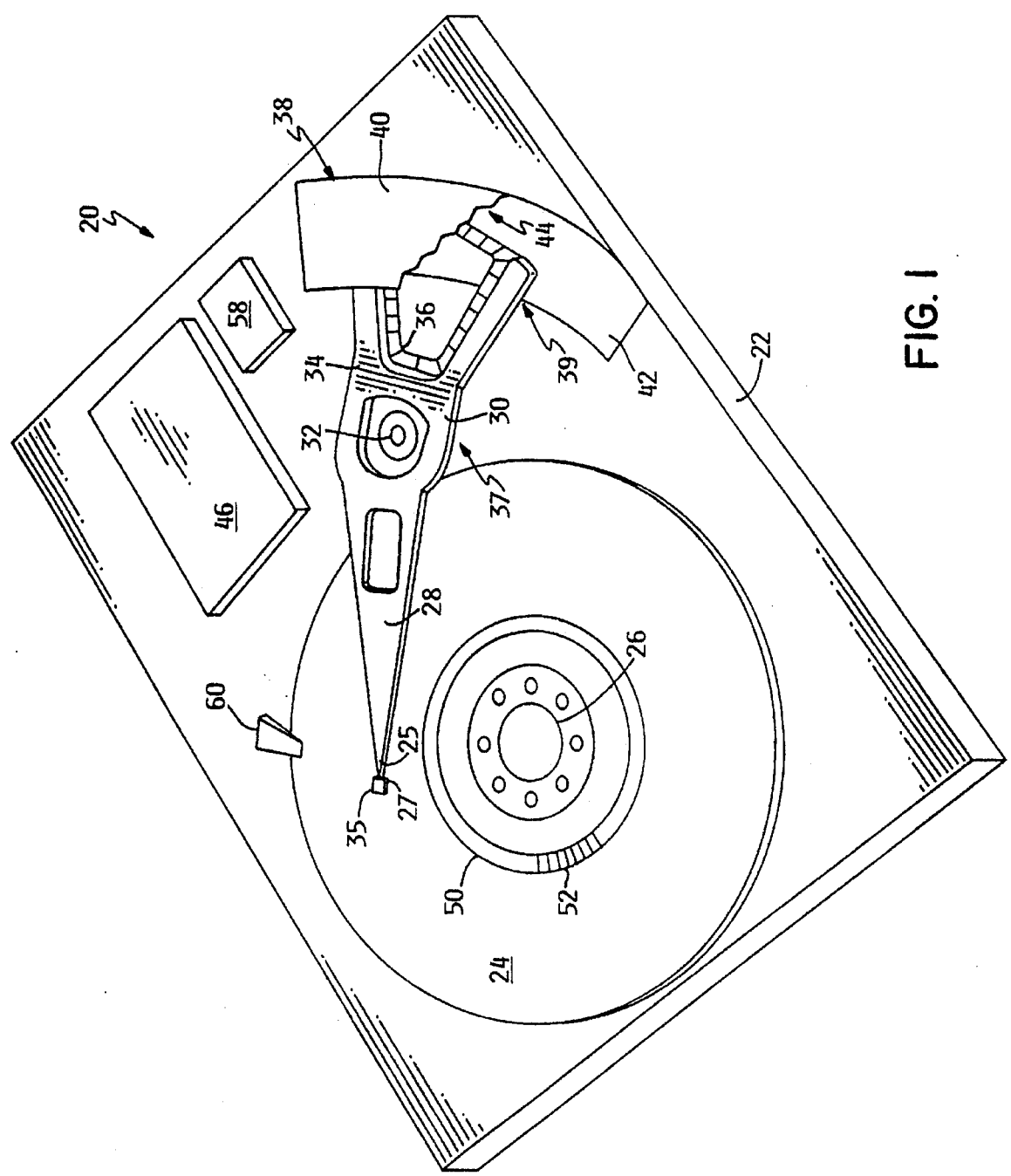
FIG. 1 is a top perspective view of a data storage system with its upper housing cover removed.

Accordingly, the invention comprises a polymeric photoinitiator, and use of the polymeric photoinitiator in various adhesive compositions, and products resulting therefrom.

A. The Polymer

Generally, the polymeric photoinitiator of the invention has the following composition:

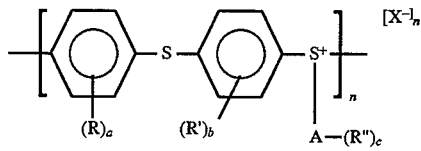

wherein $n=10$ to 150; each of a and b are 0–4 and c is 0–5; A is a branched or unbranched alkyl or a substituted or unsubstituted aryl; X is an anion; and each of R, R', and R" is H or one or more groups substituted onto the respective phenyl. The substituted groups (r, R', and R") are independently selected from various kinds of groups excluding basic groups such as amino groups. Preferably, they are a hydrogen atom, halogen atom (e.g., F, Cl, Br, and I), nitro group, alkoxy group (e.g., $CH_3O$— and $C_2H_5O$—), $C_1$–$C_{18}$ aliphatic group (e.g., hydrocarbon group such as $CH_3$—, $C_2H_5$—, and $(CH_3)_2CH$—; cyclic hydrocarbon group such as cyclohexyl group; and those which contain a heteroatom in the main chain or substituent group (e.g., $$-CH_2-\overset{O}{\overset{\|}{O}}CCH_3 \quad -S-CH_3, \quad -O-CH_2-OH,$$

$$-O-CH_2Ph, \text{ and } -\overset{O}{\overset{\|}{C}}Ph),$$

or substituted or unsubstituted phenyl group, phenoxy group, or thiophenoxy group.

Each of R, R', and R" may also be independently a $C_{1-18}$ aliphatic group having at least one hydroxyl group such as a monoalcohol and polyalcohol represented by, for example, —$CH_2OH$, —$CH_2CH_2OH$, —$O$—$CH_2CH_2$—$CH_2CH_2$—$OH$, —$SCH_2CH_2OH$, $-OCH_2-CH_2-CH_3$, 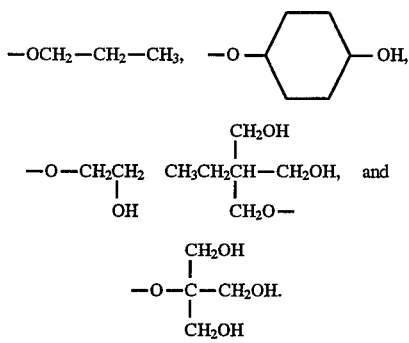

$$-O-CH_2CH_2 \quad CH_3CH_2\overset{CH_2OH}{\underset{CH_2O-}{\overset{|}{CH}}}-CH_2OH, \text{ and}$$
$\quad\quad\quad |$
$\quad\quad\quad OH$ $$-O-\overset{CH_2OH}{\underset{CH_2OH}{\overset{|}{C}}}-CH_2OH.$$

Each of R, R', and R" may also be a $C_{3-19}$ group having at least one group of —$OCH_2CH_2O$—independently a $CH_2O$—$CH_2$—$CH_2$—$O$—$CH_3$, $$-O-CH_2CH_2O-\overset{O}{\overset{\|}{C}}CH_3,$$

Preferably, each of R, R', and R" may independently be a linear or branched $C_{1-4}$ alkyl group such as methyl, ethyl, propyl or butyl; an alkoxy group such as those with ester, ether, or carboxyl, functionality; and hydrogen.

In turn, A may be a substituted or unsubstituted aryl or a linear or branched alkyl. Representative groups include linear or branched $C_{1-6}$ alkyl, as well as alkoxy including $C_{1-6}$ symmetric or symmetric ether groups. Representative aryl groups include unsubstituted phenyl or phenyl substituted at any of meta, para, or ortho positions. Any of R, R', and R" (if A is an aryl group) may be meta, ortho, or para directed relative to the carbon-sulphur bond in order to aid in synthesis of the polymer.

B. Synthesis

The polymeric photoinitiator disclosed above results from polymerization of various sulfonium monomers. This monomeric unit has the formula:

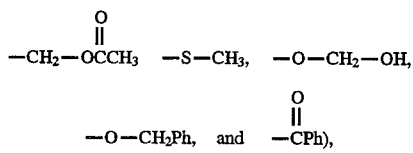

Ar of the above fused aromatic radical that is selected from the group of naphthyl, anthracyl, peryl, and pyryl. $R_1$ is a divalent bridge selected from the group of alkylene and alkenylene, alkylene and alkenylene chains broken with an oxygen atom; and substituted derivatives of the above chains. The substituted derivatives are those having pendent from the chain a hydroxyl group. $R_1$ usually contains about 1–10 carbon atoms and preferably about 1–4 carbon atoms.

Examples of specific $R_1$ bridges include methylene, ethylene, propylene, isopropylidene, butylene, isobutylene, oxymethylene, oxypropylene, and 3-hydroxy-1-oxybutylene.

Each $R_2$ and $R_3$ is individually an alkyl, aryl, substituted aryl, alkaryl, or aralkyl group, provided that not more than one of $R_2$ and $R_3$ is an alkyl group. Generally, the alkyl groups contain 1–12 carbon atoms and preferably 1–4 carbon atoms, examples of which are methyl, ethyl, propyl, isopropyl, and butyl. The aryl groups can contain 6–12 carbon atoms and include phenyl, biphenyl, and naphthyl. The substituted aryl groups are generally those substituted with one of the groups of OH, OR', NH$_2$, NR'R" wherein each R' and R" is individually an alkyl group containing generally 1–4 carbon atoms, including methyl and ethyl. The alkaryl groups generally contain about 1–18 carbon atoms and preferably about 7–10 carbon atoms and include phenyl, and ethylbenzyl. The aralkyl groups usually contain from about 7–18 carbon atoms and preferably from about 7–10 carbon atoms and include tolyl and xylol. X$^-$, in the above formula is a non-nucleophilic anion which can be SbF$^-_6$, PF$^-_6$, AsF$^-_6$, BF$^-_4$, CF$_3$SO$^-_3$, or ClO$^-_4$.

Synthesis of the polymer of the invention may be undertaken over several discrete steps. Generally, the first portion of the synthesis is the formation of a sulfonium salt from reaction of sulfone such as a diaryl sulfone or preferably an alkyl diaryl sulfone with a diaryl sulfide. This reaction may be completed using equivalent mole ratios of each precursor compound. Preferably, the reaction is undertaken in a cooled environment, in the presence of an acid such as methane sulfonic acid. The reaction should be continued for a time ranging from 20 hours to 30 hours. After this time, the reaction product may be extracted over an acidic aqueous/organic interface to purify and concentrate the product. The organic layer may be dried over anhydrous sodium sulfate to provide a residue which may be purified by recrystallization with ether. The reaction scheme is shown in equation [I] below.

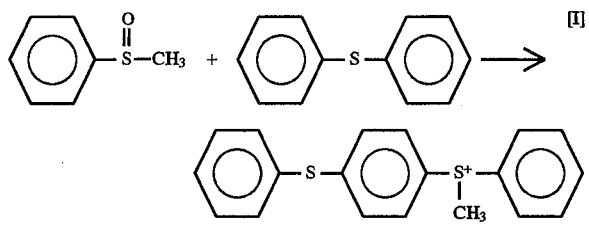

As shown in equation [I], the sulfone methyl group may also be any C$_{2-6}$ linear or branched alkyl group or any substituted or unsubstituted phenyl group.

In the next step of the synthesis, an aromatic catenated sulfide is produced by subjecting the sulfonium salt produced in the reaction shown in equation [I] to a nucleophile. A nucleophile, such as pyridine, strips the pendent alkyl or aryl group from the sulfonium salt producing a catenated sulfide. The reaction is undertaken by placing the sulfonium salt into a nucleophilic solvent with mixing. The temperature of the mixture may be slowly increased to 100° C. and the reaction continued for 10 minutes to 20 minutes. The resulting product may then be extracted, purified, and dried by means known to those of skill in the art. The reaction scheme is shown below in equation [II].

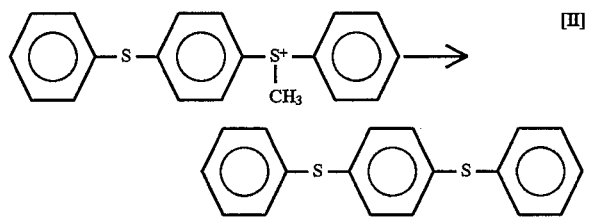

As shown in equation [II], the sulfonium salt has been demethylated. Here again, the reaction of equation [II] may be to dealkylate or arylate the sulfonium salt as indicated earlier.

The precursor to the polymer of the invention, an aromatic sulfoxide, may then be produced from the catenated aromatic sulfide. In this instance, the catenated aromatic sulfide is exposed to an equimolar concentration of oxidizing agent such as bromine, or hydrogen peroxide (30 wt-%), sodium periodate, tert butoxy chloride, sodium perborate, or any suitable peracid in the presence of a suitable buffer such as sodium bicarbonate and water. Additionally, various compounds may be used to ensure adequate solubility of precursors and, in turn, full reaction. The product may then be extracted, purified and dried by means known to those of skill in the art. The reaction scheme is shown below in equation [III].

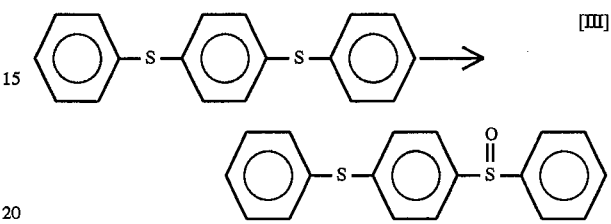

The final step in the synthesis is the polymerization of the aromatic sulfoxide, see equation [IV] below. To polymerize the sulfoxide, an electrophile, such as an acid, is used to protonate the sulfoxide and strip the oxygen from the sulfur atom in the form of water. At the same time, an electrophile should be used which will not effect the anionic species [X$^-$] so that this anion remains large and non-nucleophilic. Appropriate electrophiles include hexafluorophosphoric acid, hexafluoro arsenic acid (HAUF$_6$), hexafluoroantimonic acid, or trifluoromethane sulfonic acid. The viscosity of the reaction mixture gradually increases during polymerization. After precipitation in water, the poly(sulfonium cation) is quantitatively isolated as a resin having the empirical formula, C$_{18}$H$_{14}$S$^+_2$.

The resulting polymer has a molecular weight which ranges from about 10$^4$ to 10$^5$.

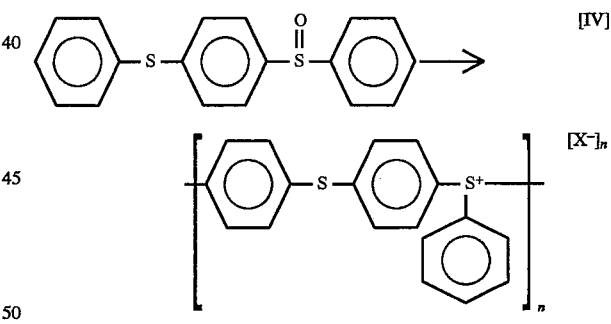

Method of Use

The photoinitiator of the invention may be used in any number of forms including neat, in solution, or in the intended adhesive. The polymer of the invention when used as a photoinitiator, are generally employed in the adhesive in amounts up to about 5 wt-% based upon the material being polymerized and preferably from about 2 wt-% to about 3 wt-%.

When present in solution, the polymeric photoinitiator of the invention has a concentration of from about 20 wt-% to 50 wt-%, and more preferably from about 30 wt-% to about 50 wt-%, and most preferably from about 40 wt-% to about 50 wt-%. Appropriate solvent systems for the polymer of the invention are those which have a high solubility parameter, (22 MPa$^{0.5}$ or greater) such as gamma butyrolactone, propylene carbonate, dimethylsulfoxide, N-methylpyrollidone, dimethylformamide, or mixtures thereof. In use, the polymeric photoinitiator is mixed with the chosen adhesive, applied to the substrate of choice and exposed to U.V. energy having a wavelength of about 200–500 μm, and preferably about 254μm or about 365 μm in accordance with methods known to those of skill in the art.

The polymers of the present invention can be used as photoinitiators for cationic polymerization such as polymerizations of epoxy polymer, phenolplast, amino plast, polyvinylacetyls, cyclic ethers, and cyclic esters such as those disclosed in U.S. Pat. No. 5,047,568 issued Sep. 10, 1991 to Angelo et al, which is incorporated herein by reference.

In its most preferred mode, the polymeric photoinitiator of the invention may be used to cure epoxy resins. Typical examples of epoxy polymers include the epoxidized novolak polymers and the polyepoxides from halo-epoxy alkanes such as epichlorohydrin and a polynuclear dihydric phenol such as bisphenol A. Mixtures of epoxides can be used when desired.

The epoxidized novolak polymers are commercially available and can be prepared by known methods by the reaction of a thermoplastic phenolic aldehyde of a phenol with a halo-epoxy alkane. The phenol can be a mononuclear or polynuclear phenol.

Examples of mononuclear phenols have the formula:

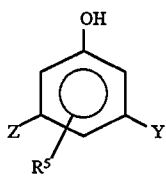

Hydrocarbon-substituted phenols having two available positions ortho or para to a phenolic hydroxy group for aldehyde condensation to provide polymers suitable for the preparation of epoxy novolaks include o- and p-cresols, o- and p-ethyl phenols, o- and p-isopropyl phenols, o- and p-tert-butyl phenols, o- and p-secbutyl phenols, o- and p-amyl phenols, o- and p-octyl phenols, o- and p-nonyl phenols, 2,5-xylenol, 3,4-xylenol, 2,5-diethyl phenol, 3,4-diethyl xylenol, 2,5-diisopropyl phenol, 4-methyl resorcinol, 4-ethyl resorcinol, 4-isopropyl resorcinol, 4-tert-butyl resorcinol, o- and p-benzyl phenol, o- and p-phenethyl phenols, o- and p-phenyl phenols, o- and p-tolyl phenols, o- and p-xylol phenols, o- and p-cyclohexyl phenols, o- and p-cyclopentyl phenols, 4-phenethyl resorcinol, 4-tolyl resorcinol, and 4-cyclohexyl resorcinol.

Various chloro-substituted phenols which can also be used in the preparation of phenol-aldehyde resins suitable for the preparation of the epoxy novolaks include o- and p-chlorophenols, 2,5-dichloro-phenol, 2,3-dichloro-phenol, 3,4-dichloro-phenol, 2-chloro-3-methyl-phenol, 2-chloro-5-methyl-phenol, 3-chloro-2-methyl-phenol, 5-chloro-2-methyl-phenol, 3-chloro-4-methyl-phenol, 4-chloro-3-methyl-phenol, 4-chloro-3-ethyl-phenol, 4-chloro-3-isopropyl-phenol, 3-chloro-4-phenyl-phenol, 3-chloro-4-chloro-phenyl-phenol, 3,5-dichloro-4-methyl-phenol, 3,5-dichloro-5-methyl-phenol, 3,5-dichloro-2-methyl-phenol, 2,3-dichloro-5-methylphenol, 2,5-dichloro-3-methyl-phenol, 3-chloro-4,5-dimethyl-phenol, 4-chloro-3,4-dimethyl-phenol, 2-chloro-3,5-dimethyl-phenol, 5-chloro-2,3-dimethyl-phenol, 5-chloro-3,5-dimethyl-phenol, 2,3,5-trichloro-phenol, 3,4,5-trichloro-phenol, 4-chloro-resorcinol, 4,5-dichloro-resorcinol, 4-chloro-5-methyl-resorcinol, 5-chloro-4-methyl-resorcinol.

Typical phenols which have more than two positions ortho or para to a phenolic hydroxy group available for aldehyde condensation and which, by controlled aldehyde condensation, can also be used are: phenol, m-cresol, 3,5-xylenol, m-ethyl and m-isopropyl phenols, m,m'-diethyl and diisopropyl phenols, m-butyl-phenols, m-amyl phenols, m-octyl phenols, m-nonyl phenols, resorcinol, 5-methyl-resorcinol, 5-ethyl resorcinol.

Examples of polynuclear dihydric phenols are those having the formula:

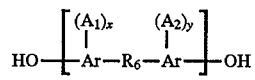

wherein Ar is an aromatic divalent hydrocarbon such as naphthylene and, preferably, phenylene: $A_1$ and $A_2$ which can be the same or different are alkyl radicals, preferably having from 1 to 4 carbon atoms, halogen atoms, i.e., fluorine, chlorine, bromine, and iodine, or alkoxy radicals, preferably having from 1 to 4 carbon atoms; x and y are integers having a value 0 to a maximum value corresponding to the number of hydrogen atoms on the aromatic radical (Ar) which can be replaced by the substituents and $R_6$ is a bond between adjacent carbon atoms as in dihydroxydiphenyl or is a divalent radical including, for example:

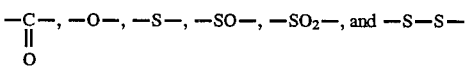

and divalent hydrocarbon radicals, such as alkylene, alkylidene, cycloalphatic, e.g., cycloalkylene and cycloalkylidene, halogenated, alkoxy or aryloxy substituted alkylene, alkylidene and cycloaliphatic radicals, as well as alkarylene and aromatic radicals including halogenated, alkyl, alkoxy or aryloxy substituted aromatic radicals and a ring fused to an Ar group; or $R^1$ can be polyalkoxy, or polysiloxy, or two or more alkylidene radicals separated by an aromatic ring, a tertiary amino group, an ether linkage, a carbonyl group or a sulfur containing group such as sulfoxide, and the like.

Examples of other specific dihydric polynuclear phenols include, among others, the bis-(hydroxyphenyl) alkanes such as 2,2'-bis-(4hydroxyphenyl)propane, 2,4'-dihydroxydiphenylmethane, bis-(2-hydroxyphenyl) methane, bis(4-hydroxyphenyl)methane, bis(4-hydroxy-2,6-dimethyl-3- methoxyphenyl)methane, 1,1'-bis-(4-hydroxyphenyl) ethane, 1,2'-bis-(4-hydroxyphenyl)ethane, 1,1'-bis-(4-hydroxy-2-chlorphenyl)ethane, 1,1'-bis(3-methyl-4-hydroxyphenyl)ethane, 1,3'-bis-(3-methyl-4-hydroxyphenyl)propane, 2,2'-bis-(3-phenyl-4-hydroxyphenyl)propane, 2,2'-bis-(3-isopropyl-4-hydroxyphenyl)propane, 2,2'-bis(2-isopropyl-4-hydroxyphenyl)pentane, 2,2'-bis-(4-hydroxyphenyl) heptane, bis-(4-hydroxyphenyl)phenylmethane, bis-(4-hydroxyphenyl)cyclohexylmethane, 1,2'-bis-(4-hydroxyphenyl)-1,2'-bis-(phenyl)propane and 2,2'-bis-(4-hydroxyphenyl)-1-phenyl-propane; di(hydroxyphenyl) sulfones such as bis-(4-hydroxyphenyl)sulfone, 2,4'-dihydroxydiphenylsulfone, 5'-chloro-2,4'-dihydroxydiphenyl sulfone, and 5'-chloro-4,4'-dihydroxydiphenyl sulfone; di(hydroxyphenyl)ethers such as bis-(4-hydroxy-phenyl)ether, the 4,4'-, 4,2'-, 2,2'-, 2,3'-, dihydroxydiphenyl ethers, 4,4'-dihydroxy-2,6-dimethyldiphenyl ether, bis-(4-hydroxy-3-isobutylphenyl)

ether, bis-(4-hydroxy-3-isopropylphenyl)ether, bis-(4-hydroxy-3-chlorophenyl)ether, bis-(4-hydroxy-3-fluorophenyl) ether, bis-(4-hydroxy-3-bromophenyl)ether, bis-(4-hydroxynaphthyl)ether, bis-(4-hydroxy-3-chloronaphthyl)ether, bis-(2-hydroxydiphenyl)ether, 4,4'-dihydroxy-2,6-dimethoxydiphenyl ether, and 4,4'-dihydroxy-2,5-diethoxydiphenyl ether.

The preferred dihydric polynuclear phenols are represented by the formula:

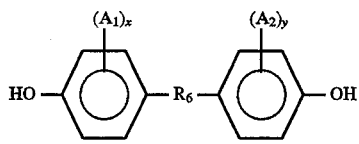

wherein $A_1$ and $A_2$ are as previously defined, x and y have values from 0 to 4 inclusive and $R_6$ is a divalent saturated aliphatic hydrocarbon radical, particularly alkylene and alkylidene radicals having from 1 to 3 carbon atoms, and cycloalkylene radicals having up to and including 10 carbon atoms. The most preferred dihydric phenol is bisphenol A, i.e. 2.24-bis(p-hydroxyphenyl)propane.

As condensing agents, any aldehyde may be used which will condense with the particular phenol being used, including formaldehyde, acetaldehyde, propionaldehyde, butyraldehyde, heptaldehyde, cyclohexanone, methyl cyclohexanone, cyclopentanone, benzaldehyde, and nuclear alkyl-substituted benzaldehydes, such as toluic aidehyde, naphthaldehyde, furfuraldehyde, glyoxal, acrolein, or compounds capable of engendering aldehydes such as para-formaldehyde, hexamethylene tetramine. The aldehydes can also be used in the form of a solution, such as the commercially available formaline. The preferred aldehyde is formaldehyde.

The halo-epoxy alkane can be represented by the formula:

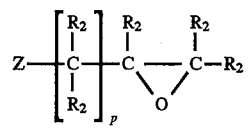

wherein X is a halogen atom (e.g., chlorine, bromine, and the like), p is an integer from 1–8, each $R_2$ individually is hydrogen or alkyl group of up to 7 carbon atoms; wherein the number of carbon atoms in any epoxy alkyl group totals no more than 10 carbon atoms.

While glycidyl ethers, such as derived from epichlorohydrin, are particularly preferred in the practice of this invention, the epoxy polymers containing epoxyalkoxy groups of a greater number of carbon atoms are also suitable. These are prepared by substituting for epichlorohydrin such representative corresponding chlorides or bromides of monohydroxy epoxyalkanes as 1-chloro-2,3-epoxybutane, 1-chloro-3,4-epoxybutane, 2-chloro-3,4-epoxybutane, 1-chloro-2-methyl-2,3-epoxypropane, 1-bromo-2,3-epoxypentane, 2-chloromethyl-1,2-epoxybutane, 1-bromo-4-methyl-3,4-epoxypentane, 1-bromo-4-ethyl-2,3-epoxypentane, 4-chloro-2-methyl-2,3-epoxypentane, 1-chloro-2,3-epoxyoctane, 1-chloro-2-methyl-2,3-epoxyoctane, or 1-chloro-2,3-epoxydecane. Although it is possible to use haloepoxyalkanes having a greater number of carbon atoms than indicated above, there is generally no advantage in using those having a total of more than 10 carbon atoms.

In addition, the polyepoxides of halo epoxy alkane of the type discussed above and a polynuclear dihydric phenol of the type above can be employed. The preferred polyepoxides of this class being the polyepoxides of epichlorohydrin and bisphenol A, i.e., 2,2-bis(p-hydroxyphenyl)propane.

The composition of the invention may be used for any number of adhesive applications where adhesives are used to assemble various component parts. As mentioned earlier, one preferred application is in the assembly of component parts in hard disk drives such as the adhering of read/write heads to data storage systems.

Figure 2:
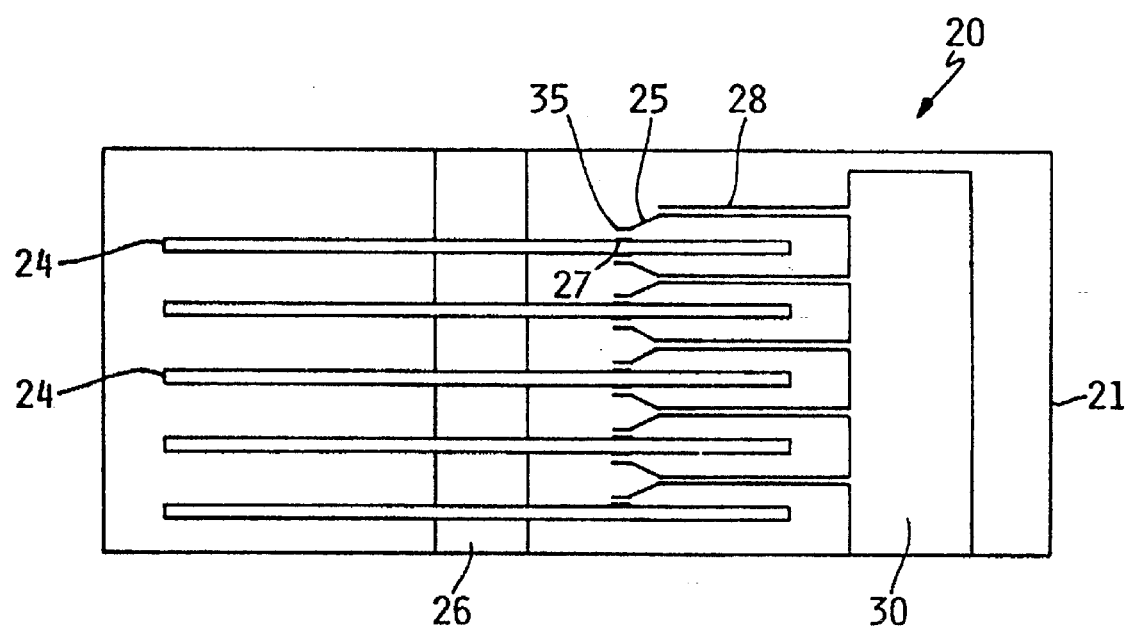
FIG. 2 is a side plan view of a data storage system comprising a plurality of data storage disks.

Turning to FIGS. 1 and 2, there is shown a exemplary data storage system 20 with the cover 23 removed from the base 22 of the housing 21. The data storage system 20 typically includes one or more rigid data storage disks 24 which are stacked coaxially in a tandem spaced relationship, and rotate about a spindle motor 26 at a relatively high rate of rotation. Each disk 24 is typically formatted to include a plurality of spaced concentric tracks 50, with each track being partitioned into a series of sectors 52 which, in turn, are further divided into individual information fields. One or more of the disks 24 may alternatively be formatted to include a spiralled track configuration.

An actuator 30 typically includes a plurality of interleaved actuator arms 28, with each arm having one or more transducer 27 and slider body 35 assemblies mounted to a load beam 25 for reading and writing information to and from the data storage disks 24. The slider body 35 is typically designed as an aerodynamic lifting body that lifts the transducer 27 off of the surface of the disk 24 as the rate of spindle motor 26 rotation increases, and causes the transducer 27 to hover above the disk 24 on an air bearing or airflow patterns produced by high-speed disk rotation. A conformal lubricant may alternatively be disposed on the disk surface 24 to reduce static and dynamic friction between the slider body 35 and disk surface 24.

In a typical digital data storage system, digital data is stored in the form of magnetic transitions on a series of concentric, closely spaced tracks comprising the surface of the magnetizable rigid data storage disks. The tracks are generally divided into a plurality of sectors, with each sector comprising a number of information fields. One of the information fields is typically designated for storing data, while other fields contain sector identification and synchronization information, for example. Data is transferred to, and retrieved from, specified track and sector locations by the transducers being shifted from track to track, typically under the control of a controller. The transducer assembly typically includes a read element and a write element. Other transducer assembly configurations incorporate a single transducer element used to write data to the disks and read data from the disks.

Writing data to a data storage disk generally involves passing a current through the write element of the transducer assembly to produce magnetic lines of flux which magnetize a specific location of the disk surface. Reading data from a specified disk location is typically accomplished by a read element of the transducer assembly sensing the magnetic field or flux lines emanating from the magnetized locations of the disk. As the read element passes over the rotating disk surface, the interaction between the read element and the magnetized locations on the disk surface results in the production of electrical signals in the read element. The electrical signals correspond to transitions in the magnetic field.

The composition of the invention may be used to cure thermoset adhesives in any number of given applications. One preferred application as illustrated above is the application of transducers to the actuator arm of a disk drive system. By applying the transducer such as a read-write lead to the actuator arm in the disk drive environment, outgassing of low molecular weight volatile compounds is reduced thereby reducing the potential for disk malfunction.

WORKING EXAMPLES

The following working examples are intended to be illustrative of the invention.

WORKING EXAMPLE 1

Synthesis of Methylphenyl [4-thiophenoxy] phenylsulfonium perchlorate

A 300-mL, three-neck, round-bottom flask, which has a thermometer and $N_2$ gas inlet and is equipped with a Teflon-covered magnetic stirring bar, is charged with methylphenylsulfone (7 g, 50 mmol) and diphenylsulfide (9.3 g, 50 mmol). The reaction mixture is cooled to 0° C. Methanesulfonic acid (100 mL) is added to the reaction vessel. The temperature is gradually raised to room temperature over a 30-min period. The reaction is continued for 20 h at room temperature. The reaction mixture is then poured into perchloric acid (60%, 100 mL) and stirred for 1 h at room temperature, and then water (100 mL) and dichloromethane (100 mL) were added. The aqueous layer is extracted with dichloromethane (2×50 mL). The organic layer is dried over anhydrous sodium sulfate. After evaporation, a residue is purified by recrystallization with ether. The solid is dried under vacuum at room temperature for 20 h.

WORKING EXAMPLE 2

Synthesis of Phenyl [4-thiophenoxy] sulfoxide

A 200-mL, three-neck, round-bottom, flask which had a reflux condenser and $N_2$ gas inlet and is equipped with a Teflon-covered magnetic stirring bar, is charged with methylphenyl[4-(thiophenoxy) phenyl] sulfonium perchlorate (10 g, 24.5 mmol). Pyridine (50 mL) is added at room temperature and stirred for 30 min at room temperature. The temperature is increased to 100° C., and the reaction is continued for 10 min. The reaction mixture is poured into 10% HCl solution (300 mL) and is extracted with dichloromethane. The product is purified by flash column chromatography on silica gel using hexane-chloroform (3:1) as the eluent. After evaporation of the solvents, a product is obtained. The product is dried under vacuum at room temperature for 20 h.

WORKING EXAMPLE 3

Synthesis of Phenyl[4-(thiophenpxy)phenyl]sulfide

A 500-mL, round-bottom flask with a Teflon-covered magnetic stirring bar is charged with dichloromethane (50 mL), 10% $KHCO_3$ (43 mL), and phenyl[4-(thiophenoxy) phenyl]sulfoxide (5 g, 17.0 mmol). To the reaction mixture is added bromine (2.72 g, 17.0 mmol) in dichloromethane (50 mL) over a period of 5 min with vigorous stirring. The reaction is continued for 30 min. To the reaction mixture is added a KCl saturated solution and dichloromethane (100 mL). The aqueous layer is extracted with dichloromethane (2×50 mL). The organic layer is washed with water, dried over anhydrous sodium sulfate, and filtered. After recrystallization from ether, the solid is obtained. The solid is dried under vacuum at room temperature for 20 h and then is used without further purification for polymerization.

WORKING EXAMPLE 4

Polymerization of Phenyl[4-(thiophenoxy)phenyl] sulfoxide

The polymerization of the phenyl[4-(thiophenoxy) phenyl]sulfoxide is preformed in trifluoro methane sulfonic acid as the solvent. The viscosity of the reaction mixture gradually increases. The reaction mixture is poured into hexafluoroantimonic acid (60 wt-%) stirred for 1 hour at room temperature. After the precipitation in water, the poly(sulfonium cation) is quantitatively isolated as a resin having the empirical formula, $C_{18}H_{13}S_2SbF_6$.

The above discussion, examples and embodiments illustrate our current understanding of the invention. However, since many variations of the invention can be made without departing from the spirit and scope of the invention, the invention resides wholly in the claims hereafter appended.

I claim as the invention:

1. A data storage system comprising a hard disk drive, and a polymeric photoinitiator cured adhesive, wherein prior to curing said polymeric photoinitiator has the formula:

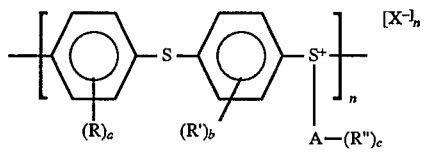

wherein n=10 to 150; each of a and b are 0–4 and c is 0–5; A is an alkyl or aryl group; X is an anion; and each of R, R', and R" is independently H or one or more groups substituted onto the respective phenyl, said substituted group selected from the group consisting of a halogen atom, a nitro group, an alkoxy group, a branched or unbranched $C_1$–$C_{18}$ aliphatic group, a cyclic hydrocarbon group, an alkyl or aryl group containing one or more heteroatoms, a $C_{1–18}$ aliphatic group having at least one hydroxyl group; and a $C_{3–19}$ group having a group of —$OCH_2CH_2O$—.

2. The assembly of claim 1 wherein said adhesive comprises an epoxy resin.

3. A method of preventing outgassing of volatile chemicals in a disk drive environment said method comprising the steps of: (a) applying an adhesive comprising a polymeric photoinitiator to the disk drive assembly, said polymeric photoinitiator having the formula:

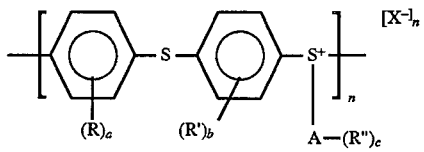

wherein n=10 to 150; each of a and b are 0–4 and c is 0–5; A is an alkyl or aryl group; X is an anion; and each of R, R', and R" is independently H or one or more groups substituted onto the respective phenyl, said substituted group selected from the group consisting of a halogen atom, a nitro group, an alkoxy group, a branched or unbranched $C_1$–$C_{18}$ aliphatic group, a cyclic hydrocarbon group, an alkyl or aryl group containing one or more heteroatoms, a $C_{1–18}$ aliphatic group having at least one hydroxyl group; and a $C_{3–19}$ group having a group of —$OCH_2CH_2O$—; and (b) curing said adhesive through the application of U.V. energy.

4. The method of claim 3 wherein said disk drive assembly comprises a read-write head affixed to the assembly by an adhesive cured with said polymeric photoinitiator.

5. The method of claim 3 wherein said adhesive comprises an epoxy resin.

6. The method of claim 5 wherein said photoinitiator is present in said adhesive composition at a concentration ranging from about 1 to 5 wt-%.

7. The method of claim 3 wherein said polymeric photoinitiator has a formula wherein each of R, R', and R" is independently selected from the group consisting of hydrogen, a branch or unbranched $C_{1-4}$ alkyl group and mixtures thereof, and A is a $C_{1-6}$ alkyl group.

* * * * *